(12) United States Patent
Chung (10) Patent No.: US 9,052,604 B2
(45) Date of Patent: Jun. 9, 2015

(54) PHOTOLITHOGRAPHY SYSTEMS AND ASSOCIATED ALIGNMENT CORRECTION METHODS

(75) Inventor: Woong Jae Chung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1258 days.

(21) Appl. No.: 12/266,202

(22) Filed: Nov. 6, 2008

(65) Prior Publication Data

US 2010/0114522 A1    May 6, 2010

(51) Int. Cl.
*G03F 9/00*    (2006.01)

(52) U.S. Cl.
CPC ............ *G03F 9/7003* (2013.01); *G03F 9/7046* (2013.01); *G03F 9/7092* (2013.01)

(58) Field of Classification Search
CPC .... G03F 9/7003; G03F 9/7046; G03F 9/7092
USPC ........................................................ 702/150
See application file for complete search history.

(56) References Cited

U.S. PATENT DOCUMENTS

| | | | |
|---|---|---|---|
| 4,780,617 A | 10/1988 | Umatate et al. | |
| 5,493,402 A | 2/1996 | Hirukawa | |
| 5,525,808 A | 6/1996 | Irie et al. | |
| 5,561,606 A * | 10/1996 | Ota et al. | 716/55 |
| 5,674,651 A | 10/1997 | Nishi et al. | |
| 5,805,866 A * | 9/1998 | Magome et al. | 716/51 |
| 5,808,910 A * | 9/1998 | Irie et al. | 700/279 |
| 5,986,766 A | 11/1999 | Koga et al. | |
| 6,278,957 B1 | 8/2001 | Yasuda et al. | |
| 6,433,352 B1 | 8/2002 | Oka et al. | |
| 6,481,003 B1 | 11/2002 | Maeda | |
| 6,826,743 B2 | 11/2004 | Park et al. | |
| 7,042,552 B1 | 5/2006 | Werkman et al. | |
| 7,184,853 B2 | 2/2007 | Roberts et al. | |
| 7,292,339 B2 * | 11/2007 | Lof | 356/401 |
| 7,875,987 B2 * | 1/2011 | Granados et al. | 257/797 |
| 8,440,475 B2 * | 5/2013 | Habets et al. | 438/16 |
| 2003/0034570 A1 * | 2/2003 | Baggenstoss | 257/797 |
| 2006/0040191 A1 | 2/2006 | Okita | |
| 2007/0133864 A1 * | 6/2007 | Morimoto | 382/151 |
| 2007/0177120 A1 | 8/2007 | Kim | |
| 2008/0058977 A1 | 3/2008 | Honda | |

* cited by examiner

*Primary Examiner* — Hyun Park
(74) *Attorney, Agent, or Firm* — Perkins Coie LLP (57) ABSTRACT

Several embodiments of photolithography systems and associated methods of alignment correction are disclosed herein. In one embodiment, a method for correcting alignment errors in a photolithography system includes detecting a first alignment error at a first location of a first microelectronic substrate and a second alignment error at a second location of a second microelectronic substrate. The second location generally corresponds to the first location. The method also includes deriving a statistical dispersion between the first alignment error and the second alignment error and associating the first and second locations with an alignment procedure based on the derived statistical dispersion.

15 Claims, 7 Drawing Sheets

PHOTOLITHOGRAPHY SYSTEMS AND ASSOCIATED ALIGNMENT CORRECTION METHODS

TECHNICAL FIELD

The present disclosure is related to photolithography systems and associated alignment methods.

BACKGROUND

Photolithography is a process commonly used in semiconductor fabrication for selectively removing portions of a thin film from or depositing portions of a film onto discrete areas of a surface of a semiconductor wafer. A typical photolithography process includes spin coating a layer of a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of the incident portion or the non-incident portion from the surface of the semiconductor wafer with a chemical solution (e.g., a "developer") to form a pattern of openings in the photoresist on the wafer. Subsequently, portions of the thin film on the surface of the semiconductor wafer can be selectively removed from or deposited onto the surface of the wafer through the openings of the photoresist mask. The photolithography process can be repeated to form layers of microelectronic features on or in the semiconductor wafer.

In the foregoing process, a new pattern must be aligned with patterns already on the semiconductor wafer before exposure. If the alignment of the new pattern is inaccurate, the new pattern may overlap and/or otherwise interfere with existing patterns on the semiconductor wafer to render the formed features inoperable. As a result, the alignment accuracy can directly impact product yields of the photolithography process. Moreover, the speed of the alignment procedure can directly impact the throughput of the photolithography process. Accordingly, several improvements for enhancing the accuracy and/or the speed of these methods and devices would be desirable.

DETAILED DESCRIPTION

Various embodiments of photolithography systems for processing microelectronic substrates and associated alignment correction methods are described below. The term "microelectronic substrate" is used throughout to include substrates upon which and/or in which microelectronic devices, micromechanical devices, data storage elements, read/write components, and other features are fabricated. Such a microelectronic substrate can include one or more conductive and/or nonconductive layers (e.g., metallic, semiconductive, and/or dielectric layers) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a microelectromechanical system, an imager, etc.). The term "photoresist" generally refers to a material that can be chemically modified when exposed to electromagnetic radiation. The term encompasses both positive photoresist configured to be soluble when activated by the electromagnetic radiation and negative photoresist configured to be insoluble when activated by light. A person skilled in the relevant art will also understand that the disclosure may have additional embodiments, and that the disclosure may be practiced without several of the details of the embodiments described below with reference to FIGS. 1-6.

Figure 1:
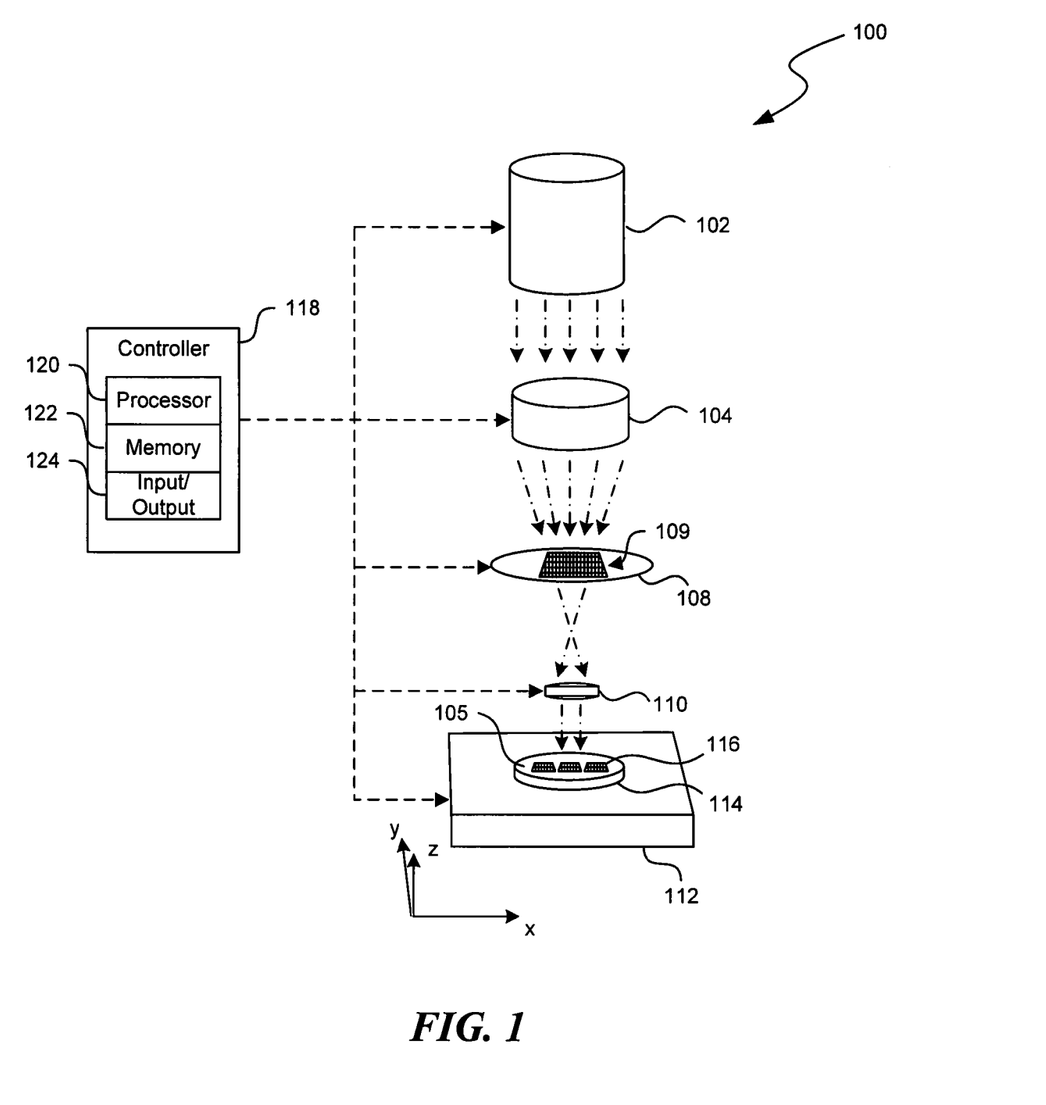
FIG. 1 is a schematic view of a photolithography system configured in accordance with an embodiment of the disclosure.

FIG. 1 is a schematic view of a photolithography system 100 configured in accordance with an embodiment of the disclosure. In the embodiment illustrated in FIG. 1, the photolithography system 100 includes an illumination source 102, a condenser lens 104, a reticle 108, an objective lens 110, and a substrate support 112 arranged in series. A controller 118 is operatively coupled to the various components of the photolithography system 100 for monitoring and/or controlling the operation of these components. In other embodiments, the photolithography system 100 can also include a substrate transport station, a structural support (e.g., a reticle support, a lens support, etc.), position sensors (e.g., a scatterometer), an immersion hood, a support actuator (e.g., an electric motor), and/or other suitable mechanical and/or electrical components.

The illumination source 102 can include an ultraviolet light source (e.g., a fluorescent lamp), a laser source (e.g., an argon fluoride excimer laser), and/or other suitable electromagnetic emission sources. The illumination source 102 can also include lenses, collimators, mirrors, and/or other suitable conditioning components (not shown). In certain embodiments, the illumination source 102 can be configured to produce a generally coherent illumination at a single frequency. In other embodiments, the illumination source 102 can also be at least partially incoherent. In further embodiments, the illumination source 102 can also be configured to generate illumination at multiple frequencies.

The condenser lens 104 can be configured to concentrate the illumination from the illumination source 102 onto the reticle 108. In certain embodiments, the condenser lens 104 can include a plurality of reflective and/or refractive lenses arranged in series. In other embodiments, the condenser lens 104 can also include collimators, mirrors, and/or other suitable illumination conditioning components. The photolithography system can also include actuators (e.g., electric motors) configured to move the condenser lens 104 relative to the illumination source 102 and/or the reticle 108 based on instructions from the controller 118.

The reticle 108 can include an opaque plate with lines, apertures, and/or transparencies that allow the illumination from the illumination source 102 to pass through in a defined pattern 109. In the illustrated embodiment, the pattern 109 includes a grating. In other embodiments, the pattern 109 can also include a collection of lines, channels, apertures, shapes, and/or other geometric elements in a suitable arrangement. In further embodiments, the reticle 108 can also include layers of material with different refraction index values and/or other suitable phase-shifting components (not shown). As a result, the reticle 108 can achieve a desired phase shift (e.g., 180°) between illumination transmitted through the pattern 109 and illumination that is transmitted through another area of the reticle 108.

Figure 2:
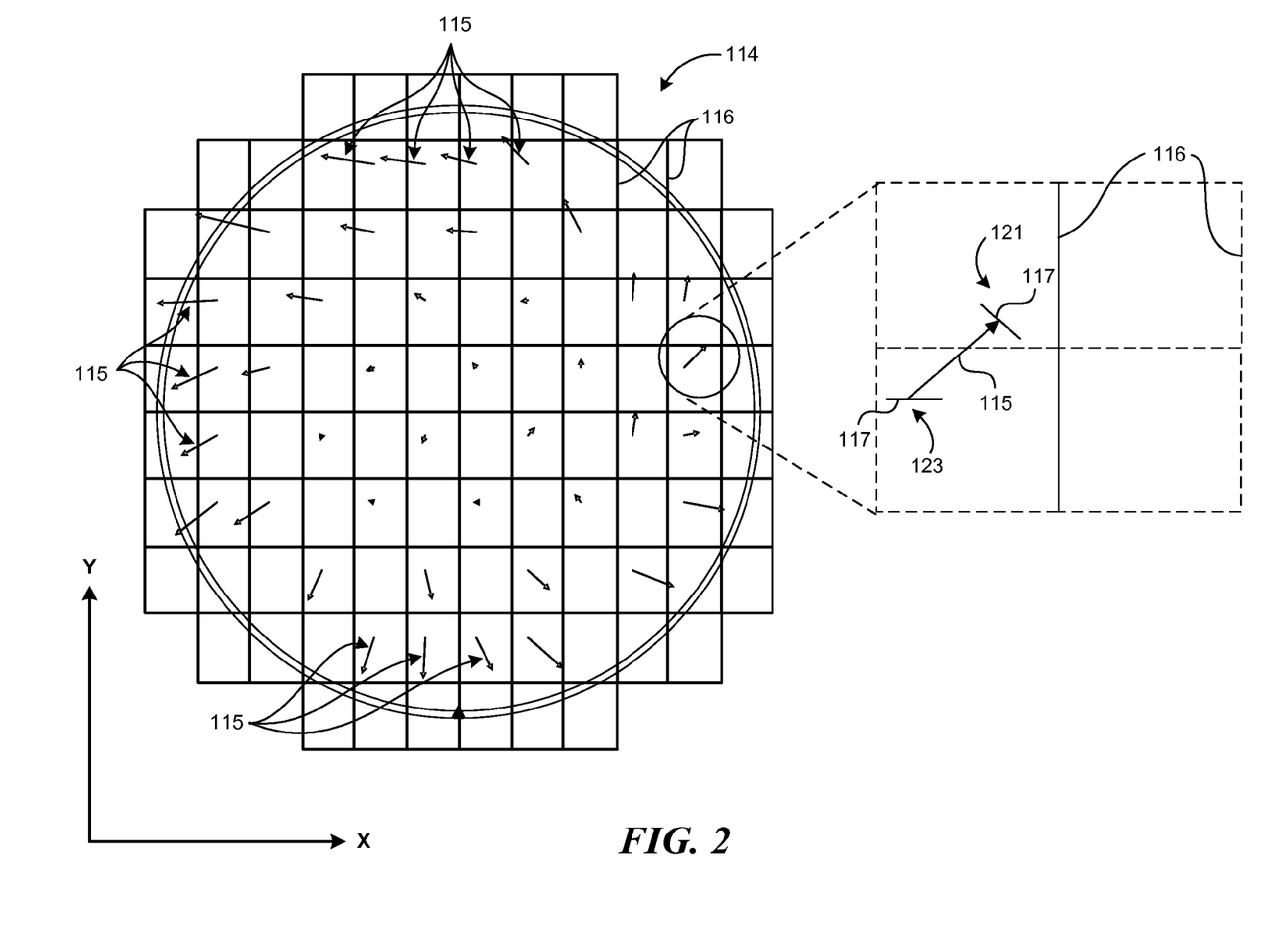
FIG. 2 is a schematic top view illustrating alignment errors of a microelectronic substrate in accordance with embodiments of the disclosure.
Figure 3:
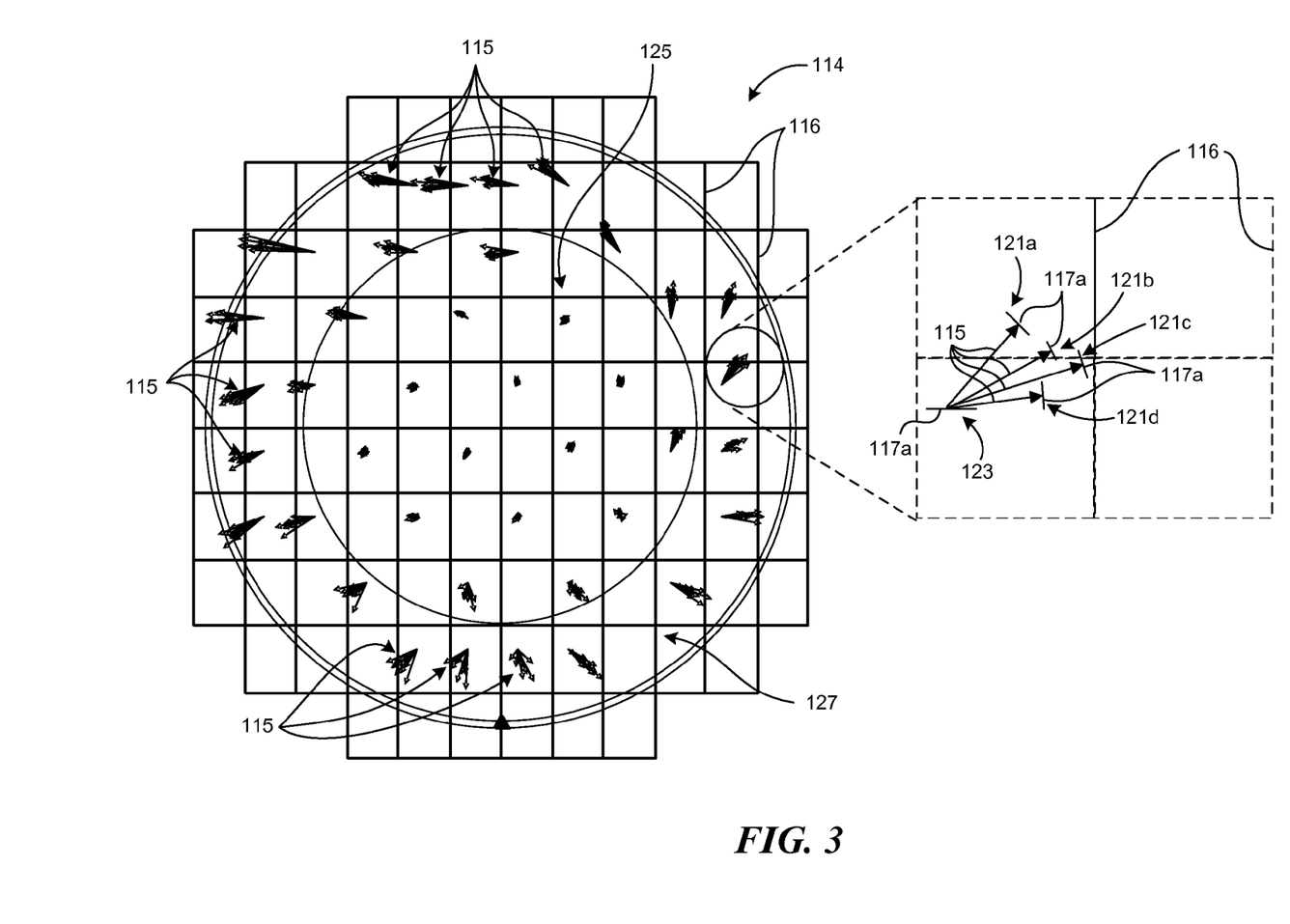
FIG. 3 is a schematic top view illustrating alignment errors of a plurality of microelectronic substrates in accordance with embodiments of the disclosure.

The objective lens 110 can be configured to project the illumination from the reticle 108 onto the photoresist 105 of the microelectronic substrate 114. As shown in FIG. 1, the photoresist 105 of the microelectronic substrate 114 can be divided into discrete areas (hereinafter referred to as "fields 116"). During exposure, the pattern 109 from the reticle 108 can be replicated or printed individually onto one of the fields 116. Even though the fields 116 are shown in FIG. 1 as spaced apart from one another, in other embodiments, adjacent fields 116 can be abutting one another, as described in more detail below with reference to FIGS. 2A and 2B, or the fields 116 can have other suitable arrangements relative to one another.

The substrate support 112 can be configured to carry the microelectronic substrate 114. The substrate support 112 can include a vacuum chuck, a mechanical chuck, and/or other suitable supporting devices. In the illustrated embodiment, the photolithography system 100 includes at least one actuator (not shown) configured to move the substrate support 112 laterally (as indicated by the X-axis), transversely (as indicated by the Y-axis), and/or vertically (as indicated by the Z-axis) relative to the reticle 108 and/or other components of the photolithography system 100. In certain embodiments, the substrate support 112 can also include a position transmitter 113 configured to monitor the position of the substrate support 112 along the X-axis, Y-axis, and/or the Z-axis. Even though only one substrate support 112 is shown in FIG. 1, in certain embodiments, the photolithography system 100 can include two, three, or any desired number of substrate supports with structures and/or functions that are generally similar to or different than the substrate support 112.

The controller 118 can include a processor 120 coupled to a memory 122 and an input/output component 124. The processor 120 can include a microprocessor, a field-programmable gate array, and/or other suitable logic devices. The memory 122 can include volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the photolithography system 100 via a communication link (e.g., a USB link, an Ethernet link, a Bluetooth link, etc.) In other embodiments, the controller 118 can include a network server operatively coupled to the other components of the photolithography system 100 via a network connection (e.g., an internet connection, an intranet connection, etc.) In further embodiments, the controller 118 can include a process logic controller, a distributed control system, and/or other suitable computing frameworks.

In operation, the photolithography system 100 can first receive a batch of microelectronic substrates 114 in a substrate transport station (not shown) and/or other suitable substrate holding device. The batch can include any desired number of microelectronic substrates 114, such as 12 or 24. A first microelectronic substrate 114 is loaded onto the substrate support 112. The individual fields 116 of the first microelectronic substrate 114 can then be aligned with the pattern 109 before exposure to the illumination source 102.

In certain embodiments, the photolithography system 100 can expose the individual fields 116 of the microelectronic substrate 114 in a step mode. For example, the controller 118 can energize the actuator(s) to move the substrate support 112 a discrete distance (commonly referred to as a "step") along the X-axis or the Y-axis. Once the field 116 is in position, the illumination source 102 illuminates the incident field 116 through the reticle 108 for a preselected period of time. The illumination is then turned off, and the controller 118 energizes the actuator(s) to move the substrate support 112 another step along either the X-axis or the Y-axis. A subsequent field 116 is exposed in a similar fashion, and this process is repeated until all of the fields 116 are exposed.

In other embodiments, the controller 118 can operate the photolithography system 100 in a scanning mode. For example, the controller 118 can control the actuators to move the substrate support 112 continuously along the X-axis or the Y-axis at a preselected speed in a first direction or a second direction opposite the first direction. As the fields 116 move along the X-axis or the Y-axis, the illumination source 102 illuminates the photoresist 105 on the microelectronic substrate 114 to print a copy of the pattern 109 in the individual fields 116. In further embodiments, the controller 118 can cause the photolithography system 100 to operate in a combination of the step mode and scanning mode.

After all the fields 116 on the first microelectronic substrate 114 are exposed, the first microelectronic substrate 114 can be removed from the substrate support 112 and undergo photoresist developing, baking, cleaning, and/or other suitable processing. A second microelectronic substrate 114 can then be loaded onto the substrate support 112 from the batch, and the foregoing exposure procedures can be repeated until at least some of the microelectronic substrates 114 in the batch are processed.

One operational difficulty with conventional implementations of the foregoing technique is that the photolithography system 100 may not adequately correct for alignment errors in different areas of the microelectronic substrate 114. One conventional technique corrects alignment errors with a linear or higher order model. For example, a first-order or a second-order polynomial may be used to predict alignment errors on the microelectronic substrate 114. The inventor has recognized that even though the linear or higher order correction may be adequate for areas that have similar substrate-to-substrate alignment errors, this technique may be inadequate for other areas that have signification substrate-to-substrate alignment error variations.

Another conventional technique corrects alignment errors based on zones of the microelectronic substrate 114. For example, a zone on the microelectronic substrate 114 may include a plurality of fields 116 and alignment marks, and an alignment correction parameter can be derived based on a weighted average or other combinations of all alignment errors in the zone. The alignment correction parameter is then applied to all the fields 116 in the zone. The inventor has recognized that such zone correction technique can adequately address substrate-to-substrate alignment error variations. However, this technique can be complex and burdensome at least because a large number of alignment marks are used.

Several embodiments of the photolithography system 100 can address the foregoing operation difficulty by applying different alignment correction techniques based on substrate-to-substrate alignment error variations for particular locations of the microelectronic substrate 114. Simulation results of the microelectronic substrate 114 processed according to several embodiments of the photolithography system 100 are schematically illustrated in FIGS. 2 and 3. However, other embodiments of the photolithography system 100 can be configured to perform other processing stages in addition to or in lieu of those described below.

FIG. 2 is a schematic top view illustrating sample alignment errors 115 of a microelectronic substrate 114, and FIG. 3 is a schematic top view illustrating alignment errors 115 of a batch of microelectronic substrates 114 in accordance with embodiments of the disclosure. In FIGS. 2 and 3, the alignment errors 115 are schematically shown as vectors. The individual vectors have a length representing a magnitude of the corresponding alignment error 115 and a direction representing an orientation of the corresponding alignment error 115.

As shown in FIG. 2, the microelectronic substrate 114 can include a plurality of alignment marks 117. The individual alignment marks 117 can include a trench, a grating, a circle, a square, and/or other suitable pattern on the microelectronic substrate 114. In the illustrated embodiment, the microelectronic substrate 114 includes thirty-two alignment marks 117 arranged in a generally circular arrangement. In other embodiments, the microelectronic substrate 114 can include any number of alignment marks 117 in any desired arrangements.

During an initial processing stage, an operator can load the microelectronic substrate 114 onto the substrate support 112 (FIG. 1) and detect a current position 121 of the individual alignment marks 117 using an alignment detector integrated into or independent from the photolithography system 100. Suitable alignment detectors include, for example, optical sensors, television cameras, and/or other suitable detectors. In certain embodiments, each current position 121 of the individual alignment marks 117 can be represented as a coordinate along the X-axis and the Y-axis. In other embodiments, the current positions 121 can be represented as a magnitude and an angle from a reference axis (e.g., the X-axis). In further embodiments, the current positions can have other suitable representations.

The operator compares the current positions 121 to corresponding reference positions 123 for individual alignment marks 117. In certain embodiments, the reference positions 123 can include the positions of the alignment marks 117 stored in the memory 122 (FIG. 1) from a previous photolithography procedure. In other embodiments, the reference positions 123 can include ideal positions for the alignment marks 117 based on the calibration of the substrate support 112 and/or calibration of the reticle 108 (FIG. 1). In further embodiments, the reference positions 123 can include other desired positions.

The operator derives alignment errors 115 for the alignment marks 117 by comparing the current positions 121 to the reference positions 123. In certain embodiments, for the individual alignment marks 117, the alignment errors 115 can include an X-direction difference, a Y-direction difference, and a rotational difference. In other embodiments, the alignment errors 115 can also include scale errors along the X-axis and/or the Y-axis, magnification errors, orthogonality errors, and/or other suitable alignment inaccuracies. The operator can then store the alignment errors 115, the corresponding alignment marks 117, and/or other suitable information in the memory 122.

The inventor has recognized that the derived alignment errors 115 at the individual alignment marks 117 for at least some of the microelectronic substrates 114 can vary from substrate to substrate. For example, as shown in FIG. 3, the alignment errors 115 associated with a particular alignment mark 117a for a plurality separate substrates 114 can have different magnitudes and directions between the current positions 121 for each substrate (identified individually as first, second, third, and fourth current positions 121a-d, respectively) and the reference position 123.

The operator and/or the processor 120 (FIG. 1) can then derive a relationship among the alignment errors 115 corresponding to the individual alignment marks 117. For example, in certain embodiments, the operator and/or the processor 120 can calculate an arithmetic mean ($\overline{X}_i$) of the X-direction difference for the particular alignment mark 117 as follows:

$$\overline{X} = \frac{\sum_{i=1}^{n} X_i}{n}$$

where $X_i$ is the X-direction difference for one of the microelectronic substrates 114 and n is the number of the microelectronic substrates 114. In other examples, the operator and/or the processor 120 can also calculate a median value, a geometric median value, a harmonic mean, a quadratic mean, a weighted mean, and/or other values of the Y-direction difference, the rotation error, and/or other measures of the alignment errors 115.

The operator and/or the processor 120 can also determine a statistical dispersion value for the alignment errors 115 corresponding to the individual alignment marks 117. For example, in one embodiment, the operator and/or the processor 120 can calculate a variance ("var") of the X-direction difference as follows:

$$\text{var} = \sum_{i=1}^{n} (\overline{X} - X_i)^2$$

In other embodiments, the operator and/or the processor 120 can calculate a standard deviation ("σ") of the X-direction difference as follows:

$$\sigma = \sqrt{\sum_{i=1}^{n} (\overline{X} - X_i)^2}$$

In further embodiments, the operator and/or the processor 120 can also calculate an interquartile range, a mean difference, a median absolute deviation, an average absolute deviation, and/or other suitable measures of statistical dispersion of the Y-direction difference, the rotation error, and/or other measures of the alignment errors 115.

Based on the derived values of statistical dispersion, the microelectronic substrate 114 is subdivided into at least a first area and a second area. In the illustrated embodiment, the first area (hereinafter referred to as the "stable area 125") contains alignment marks 117 that have a statistical dispersion value less than a selected threshold. The second area (hereinafter referred to as the "unstable area 127") contains alignment marks 117 that have a statistical dispersion value not less than a threshold. In other embodiments, the first and second areas can be divided based on other suitable criteria.

For each of the stable and unstable areas 125 and 127, a different alignment correction technique can be applied to accurately align the pattern in individual fields. For example, in certain embodiments, a linear or a higher order correction technique can be applied for the stable area 125 and a zone correction technique can be applied for the unstable area 127. In other embodiments, the operator can apply other suitable alignment correction techniques to the individual areas.

Several embodiments of the photolithography system 100 can enhance the accuracy and speed of the alignment process. According to conventional techniques, linear or higher order correction and/or zone correction are typically applied to all areas of the microelectronic substrate 114. However, uniformly applying such alignment correction techniques may not be adequate because different areas of the microelectronic substrate 114 may have different characteristics. For example, applying linear correction may be sufficient for the stable area 125 but not the unstable area 127. In another example, applying zone correction may be adequate for the unstable area 127 but would not be cost effective for the stable area 125. As a result, by identifying the stable and unstable areas on the microelectronic substrate 114, the operator can apply correction techniques most suitable for each of the different areas to enhance the accuracy and speed of the alignment process.

Even though the microelectronic substrate 114 is shown in FIG. 3 as having two areas, in certain embodiments, the microelectronic substrate 114 can be divided into three, four, or any other desired number of areas by using a plurality of desired thresholds. Additionally, the different areas may have other shapes and configurations. For example, the different areas may not be concentric and/or circular. In further embodiments, the operator can update the identified areas when processing additional batches of the microelectronic substrates 114. For example, the operator can obtain additional alignment error data by performing additional measurements as discussed above and reassimilating the additional data with those in the memory 122.

Figure 4:
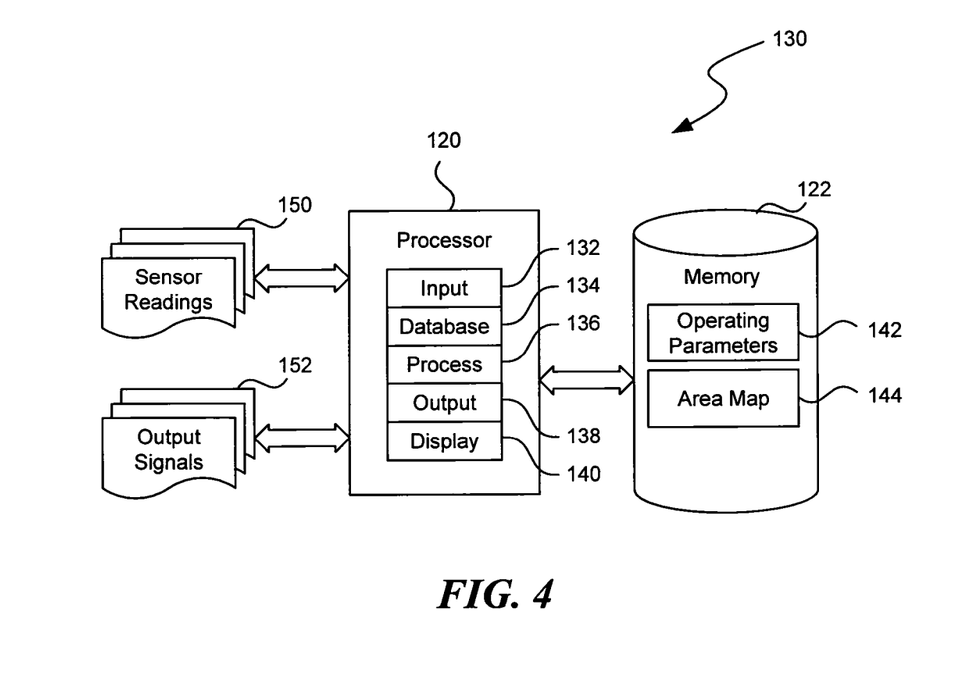
FIG. 4 is a block diagram showing computing system software modules suitable for the photolithography system of FIG. 1 in accordance with embodiments of the disclosure.

FIG. 4 is a block diagram showing computing system software modules 130 suitable for the controller 118 of FIG. 1 in accordance with embodiments of the disclosure. Each component may be a computer program, procedure, or process written as source code in a conventional programming language, such as the C++ programming language, and may be presented for execution by the processor 120 (FIG. 1) of the controller 118. The various implementations of the source code and object byte codes may be stored in the memory 122 (FIG. 1). The software modules 130 of the controller 118 may include an input module 132, a database module 134, a process module 136, an output module 138, and, optionally, a display module 140 interconnected with one another.

In operation, the input module 132 accepts an operator input, such as process setpoint and control selections (e.g., selection for step mode or scanning mode), and communicates the accepted information or selections to other components for further processing. The database module 134 organizes records, including operating parameters 142, an area map 144, and facilitates storing and retrieving of these records to and from the memory 122. The area map 144 may include measured and/or derived alignment errors for locations on the microelectronic substrate 114, as described in more detail below with reference to FIG. 5. Any type of database organization may be utilized, including a flat file system, hierarchical database, relational database, or distributed database, such as provided by a database vendor such as the Oracle Corporation, Redwood Shores, Calif.

The process module 136 generates control variables based on sensor readings 150 from sensors (e.g., position sensors of the substrate support 112) and/or other data sources, and the output module 138 generates output signals 152 based on the control variables. The processor 120 optionally may include the display module 140 for displaying, printing, or downloading the sensor readings 150, the output signals 152, and/or other information via a monitor, a printer, and/or other suitable devices.

Figure 5:
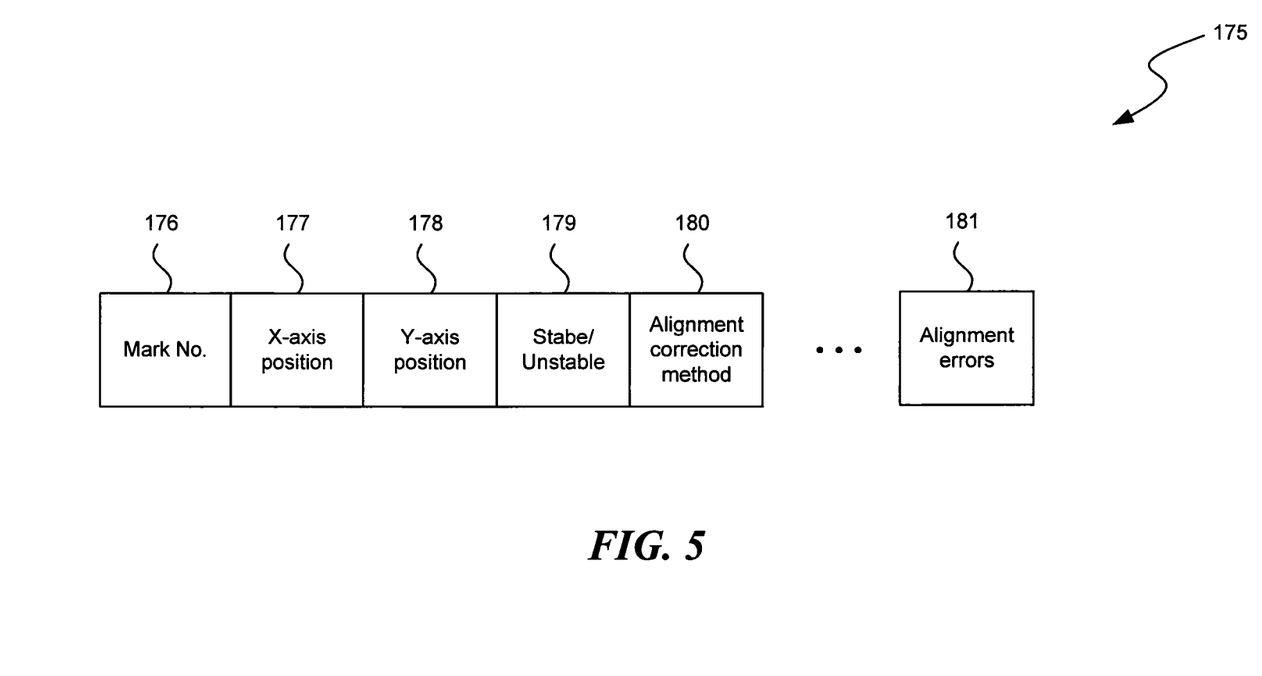
FIG. 5 is a database schema illustrating an organization of an area record in accordance with embodiments of the disclosure.

FIG. 5 is a database schema illustrating an organization of an area record 175 stored as a part of the area map 144 in the memory 122 of the controller 118 in FIG. 1. In the illustrated embodiment, only the information pertaining to the alignment errors in the area map is shown for purpose of clarity. For example, as shown in FIG. 5, the area record 175 can include the following information: an alignment mark number 176, an X-axis position 177, a Y-axis position 178, a stable/unstable indicator 179, an alignment correction method 180, and alignment errors 181 for the alignment mark. In other embodiments, the area record 175 can also include historical data, revision data, and/or other pertinent data (not shown).

Figure 6:
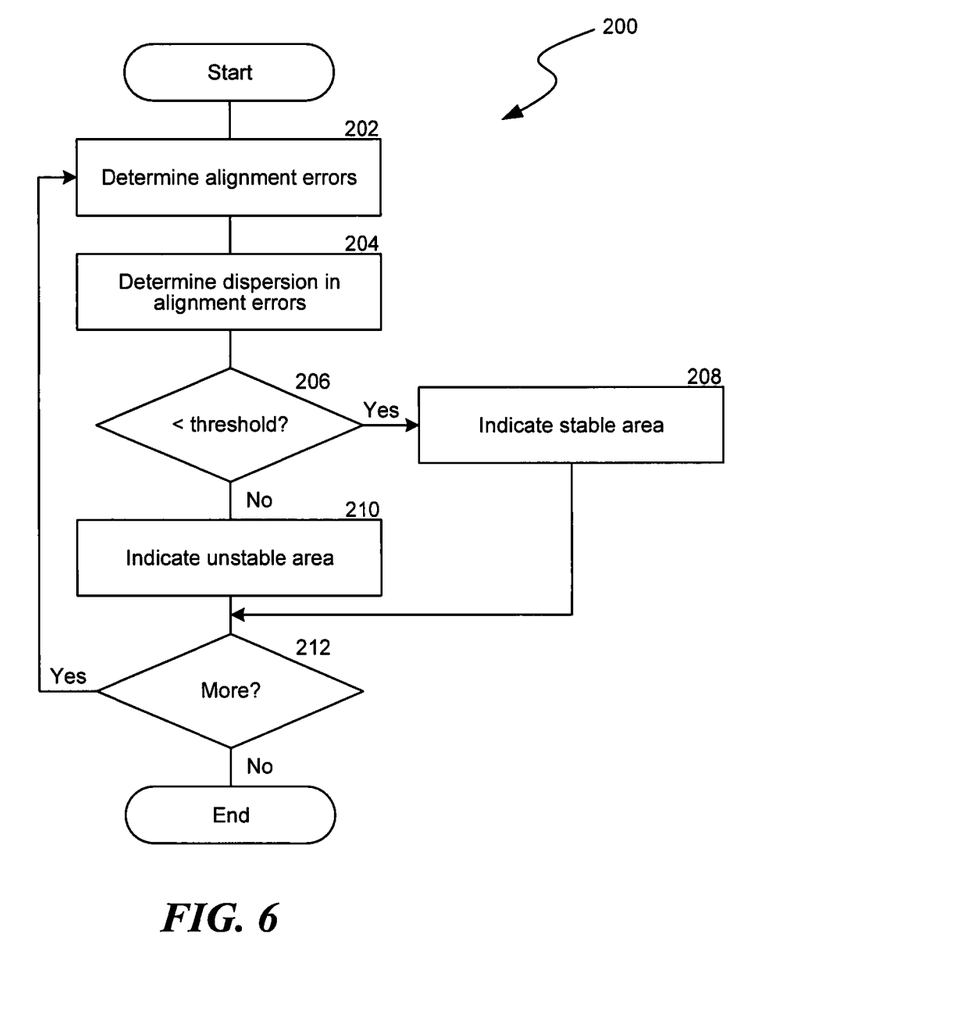
FIG. 6 is a flowchart showing a method for processing alignment errors associated with a photolithography system in accordance with embodiments of the disclosure.

FIG. 6 is a flowchart showing a method 200 for processing alignment errors associated with a photolithography system in accordance with embodiments of the disclosure. As shown in FIG. 6, the method 200 can include determining alignment errors for at least two areas on a microelectronic substrate (block 202). In one embodiment, determining alignment errors can include detecting a current position of an alignment mark and comparing the current position to a reference position. In other embodiments, determining alignment errors can also include calculating at least one of an X-direction difference, a Y-direction difference, a rotation error, and/or other suitable alignment deviation between the detected position and the reference position.

The method 200 can also include determining a dispersion of the alignment errors for the individual areas (block 204). In one embodiment, determining a dispersion includes calculating a variance and/or a standard deviation of the alignment errors for the individual areas. In other embodiments, determining a dispersion can also include calculating an interquartile range, a mean difference, a median absolute deviation, an average absolute deviation, and/or other suitable measures of statistical dispersion of the alignment errors.

A decision is made at block 206 to determine whether the dispersion of the alignment errors is less than a threshold. In one embodiment, if the dispersion of the alignment errors is less than the threshold, the area is indicated as a stable area (block 208); otherwise, the area is indicated as an unstable area (block 210). In other embodiments, multiple thresholds may be used to separate the microelectronic substrate into three, four, or other desired numbers of areas.

Another decision is made at block 212 to determine whether the process should continue. In certain embodiments, if the photolithography system includes a subsequent microelectronic substrate, the process reverts to determining alignment errors at block 202; otherwise, the process ends. In other embodiments, the process can also end based on an operator's indication.

Figure 7:
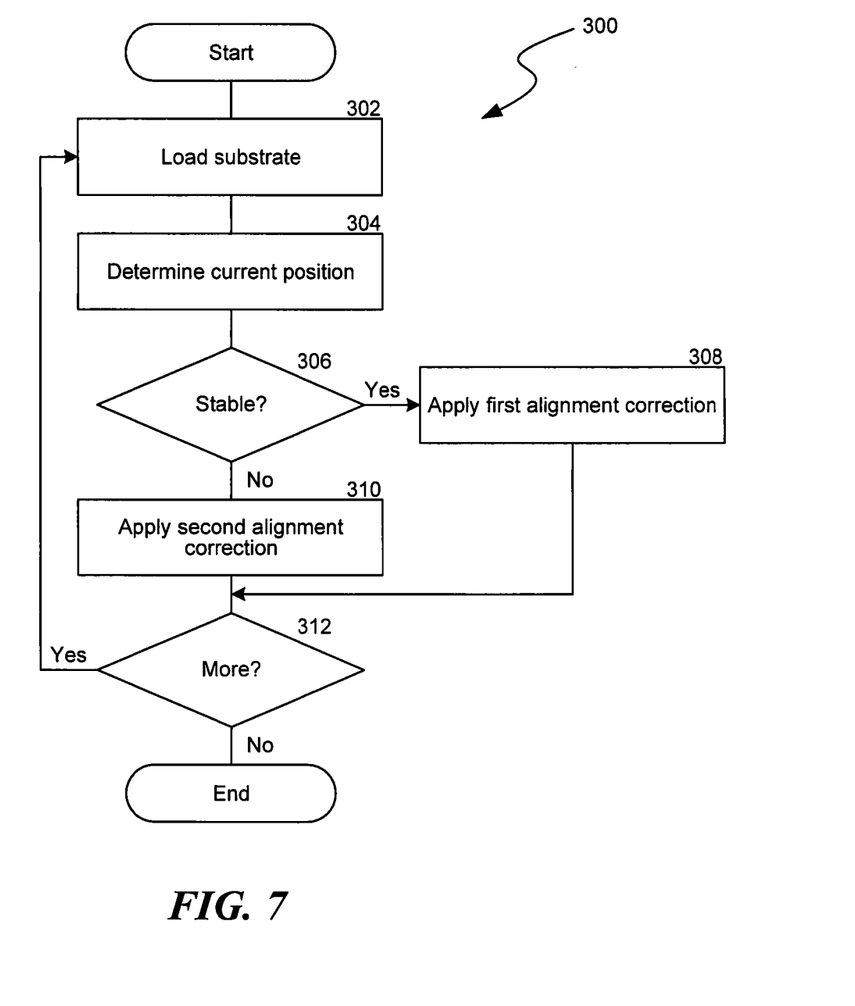
FIG. 7 is a flowchart showing a method for aligning microelectronic substrates in a photolithography system in accordance with embodiments of the disclosure.

FIG. 7 is a flowchart showing a method 300 for aligning microelectronic substrates in a photolithography system in accordance with embodiments of the disclosure. As shown in FIG. 7, the method 300 can include loading a microelectronic substrate onto a substrate support (block 302) and determining a current position of the microelectronic substrate to be exposed (block 304). The method 300 can then include a decision block 306 to determine whether the current position corresponds to a stable area or an unstable area. In certain embodiments, the determination can be made by comparing the current position to an area map stored in the photolithography system. The area map contains a plurality of records individually indicating a statistical dispersion of inter-substrate alignment errors for the current position. In other embodiments, the determination can be made based on other criteria.

If the current position corresponds to the stable area, the method 300 includes applying a first alignment correction technique for the current position (block 308); otherwise, the method 300 includes applying a second alignment correction technique for the current position (block 310). The first and second alignment correction techniques are different from each other. For example, in certain embodiments, the first alignment correction technique can include linear correction and/or higher order correction, and the second alignment correction technique can include zone correction. In other embodiments, other alignment correction techniques may be used.

Another decision is made at block 312 to determine whether the process should continue. In certain embodiments, if the photolithography system includes a subsequent microelectronic substrate, the process reverts to loading the subsequent microelectronic substrate at block 302; otherwise, the process ends. In other embodiments, the process can also end based on an operator's indication.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A method for correcting alignment errors in a photolithography system, the method comprising:
    detecting a first alignment error at a first location of a first micro electronic substrate;
    detecting a second alignment error at a second location of a second microelectronic substrate, the second location corresponding to the first location;
    deriving a statistical dispersion between the first alignment error and the second alignment error;
    comparing the statistical dispersion, using a controller, to a predetermined threshold at the first location;
    comparing the statistical dispersion, using a controller, to the predetermined threshold at the second location;
    associating the first location with a first alignment calculation based on the comparison at the first location;
    associating the second location with a second alignment calculation based on the comparison at the second location, wherein the second alignment calculation is different than the first alignment calculation; and
    wherein the first alignment calculation is a linear alignment calculation and the second alignment calculation is a zone alignment calculation.

2. The method of claim 1 wherein deriving a statistical dispersion includes calculating at least one of an arithmetic mean based on the first and second alignment errors, and calculating at least one of a variance and a standard deviation based on the arithmetic mean.

3. The method of claim 1 wherein detecting a first alignment error at a first location includes —
    determining a first current position;
    determining a first reference position; and
    comparing the first current position with the first reference position.

4. The method of claim 3 wherein determining a first current position includes defining a first X-coordinate along an X-axis of the first microelectronic substrate and a first Y-coordinate along a Y-axis of the first microelectronic substrate.

5. The method of claim 3 wherein the first reference position may be determined from a stored memory, calibration of a substrate support or calibration of a reticle.

6. The method of claim 1 wherein detecting a second alignment error at a second location includes —
    determining a second current position;
    determining a second reference position; and
    comparing the second current position with the second reference position.

7. The method of claim 6 wherein determining a second current position includes defining a second X-coordinate along an X-axis of the second microelectronic substrate and a second Y-coordinate along a Y-axis of the second microelectronic substrate.

8. The method of claim 6 wherein the second reference position may be determined from a stored memory, calibration of a substrate support or calibration of a reticle.

9. The method of claim 3 wherein the first alignment error includes an X-direction difference, a Y-direction difference or a rotational difference.

10. The method of claim 1 wherein the second alignment error includes an X-direction difference, a Y-direction difference or a rotational difference.

11. A method for correcting alignment errors in a photolithography system, the method comprising:
    detecting a first alignment error at a first location of a first microelectronic substrate;
    detecting a second alignment error at a second location of a second microelectronic substrate, the second location corresponding to the first location;
    deriving a statistical dispersion between the first alignment error and the second alignment error;
    comparing the statistical dispersion, using a controller, to a predetermined threshold at the first location;
    comparing the statistical dispersion, using a controller, to the predetermined threshold at the second location;
    associating the first location with a first alignment calculation based on the comparison at the first location;
    associating the second location with a second alignment calculation based on the comparison at the second location, wherein the second alignment calculation is different than the first alignment calculation; and
    wherein the first alignment calculation is a linear alignment calculation or a higher order alignment calculation and the second alignment calculation is a zone alignment calculation.

12. A method for correcting alignment errors in a photolithography system, the method comprising:
    detecting a first alignment error at a first location of a first microelectronic substrate;
    detecting a second alignment error at a second location of a second microelectronic substrate, the second location corresponding to the first location;

deriving a statistical dispersion, using a controller, between the first alignment error and the second alignment error;

associating the first and second locations with an alignment calculation based on the derived statistical dispersion; and wherein associating the first and second locations includes when the statistical dispersion is less than a threshold, associating the first and second locations with a first alignment calculation, else associating the first and second locations with a second alignment calculation different than the first alignment calculation; and wherein the first alignment calculation is a linear alignment calculation and the second alignment calculation is a zone alignment calculation.

13. A method for correcting alignment errors in a photolithography system, the method comprising:

detecting a first alignment error at a first location of a first microelectronic substrate;

detecting a second alignment error at a second location of a second microelectronic substrate, the second location corresponding to the first location;

deriving a statistical dispersion, using a controller, between the first alignment error and the second alignment error;

associating the first and second locations with an alignment calculation based on the derived statistical dispersion; and wherein associating the first and second locations includes when the statistical dispersion is less than a threshold, associating the first and second locations with a first alignment calculation, else associating the first and second locations with a second alignment calculation different than the first alignment calculation; and wherein the first alignment calculation is a linear alignment calculation or a higher order alignment calculation and the second alignment calculation is a zone alignment calculation.

14. A method for correcting alignment errors in a photolithography system, the method comprising:

detecting a first alignment error at a first location of a first microelectronic substrate;

detecting a second alignment error at a second location of a second microelectronic substrate, the second location corresponding to the first location;

deriving a statistical dispersion between the first alignment error and the second alignment error;

comparing the statistical dispersion, using a controller, to a predetermined threshold at the first location;

comparing the statistical dispersion, using a controller, to the predetermined threshold at the second location;

associating the first location with a first alignment calculation based on the comparison at the first location; and associating the second location with a second alignment calculation based on the comparison at the second location, wherein the first alignment calculation is a linear alignment calculation and the second alignment calculation is a zone alignment calculation.

15. A method for correcting alignment errors in a photolithography system, the method comprising:

detecting a first alignment error at a first location of a first microelectronic substrate;

detecting a second alignment error at a second location of a second microelectronic substrate, the second location corresponding to the first location;

deriving a statistical dispersion between the first alignment error and the second alignment error;

comparing the statistical dispersion, using a controller, to a predetermined threshold at the first location;

comparing the statistical dispersion, using a controller, to the predetermined threshold at the second location;

associating the first location with a first alignment calculation based on the comparison at the first location; and associating the second location with a second alignment calculation based on the comparison at the second location, wherein the first alignment calculation is a linear alignment calculation or a higher order alignment calculation and the second alignment calculation is a zone alignment calculation.

* * * * *

UNITED STATES PATENT AND TRADEMARK OFFICE
CERTIFICATE OF CORRECTION

PATENT NO.        : 9,052,604 B2                                      Page 1 of 1
APPLICATION NO.   : 12/266202
DATED             : June 9, 2015
INVENTOR(S)       : Woong Jae Chung

It is certified that error appears in the above-identified patent and that said Letters Patent is hereby corrected as shown below:

IN THE CLAIMS

In column 9, line 47, in claim 1, delete "micro electronic" and insert -- microelectronic --, therefor.

In column 10, line 32, in claim 9, delete "claim 3" and insert -- claim 1 --, therefor.

Signed and Sealed this
Eighth Day of December, 2015

Michelle K. Lee
*Director of the United States Patent and Trademark Office*